United States Patent
Liu et al.

(10) Patent No.: US 11,082,153 B2
(45) Date of Patent: Aug. 3, 2021

(54) SIGNAL SAMPLING AND RECOVERY METHOD AND APPARATUS APPLICABLE TO OVXDM SYSTEM, AND OVXDM SYSTEM

(71) Applicant: Shenzhen Super Data Link Technology Ltd., Guangdong (CN)

(72) Inventors: Ruopeng Liu, Guangdong (CN); Chunlin Ji, Guangdong (CN); Xingan Xu, Guangdong (CN); Shasha Zhang, Guangdong (CN)

(73) Assignee: SHEN ZHEN KUANG-CHI HEZHONG TECHNOLOGY LTD, Shenzhen (CN)

( * ) Notice: Subject to any disclaimer, the term of this patent is extended or adjusted under 35 U.S.C. 154(b) by 152 days.

(21) Appl. No.: 16/374,549

(22) Filed: Apr. 3, 2019

(65) Prior Publication Data

US 2019/0229842 A1    Jul. 25, 2019

Related U.S. Application Data

(63) Continuation of application No. PCT/CN2017/103310, filed on Sep. 26, 2017.

(30) Foreign Application Priority Data

Oct. 10, 2016 (CN) .......................... 201610885617.5

(51) Int. Cl.
*H04J 13/00* (2011.01)
*H04L 25/03* (2006.01)
(Continued)

(52) U.S. Cl.
CPC ............ *H04L 1/0036* (2013.01); *H04J 15/00* (2013.01); *H04L 1/00* (2013.01); *H04L 1/0014* (2013.01)

(58) Field of Classification Search
CPC ............ H04L 1/0045; H04L 25/03343; H04L 25/03299; H04L 1/0036; H04L 43/16;
(Continued)

(56) References Cited

U.S. PATENT DOCUMENTS

| 8,229,709 B2 * | 7/2012 | Boufounos | ......... H03M 7/3062 |
| | | | 702/196 |
| 9,015,007 B2 * | 4/2015 | Casey | ................. H03M 7/3062 |
| | | | 702/188 |

(Continued)

FOREIGN PATENT DOCUMENTS

| CN | 101908890 A | 12/2010 |
| CN | 103346798 A | 10/2013 |
| CN | 103595414 A | 2/2014 |

OTHER PUBLICATIONS

Xiao-Chao Xiao et al. "Compressed Channel Estimation based on Optimized Measurement Matrix", Signal Processing, vol. 28, No. 1 , Jan. 2012 (Year: 2012).*

(Continued)

*Primary Examiner* — Edan Orgad
*Assistant Examiner* — Vanneilian Lalchinthang
(74) *Attorney, Agent, or Firm* — Cantor Colburn LLP

(57) ABSTRACT

The present application discloses a signal sampling and recovery method and apparatus applicable to an OvXDM system, and the OvXDM system. The method includes: constructing, based on design parameters, an observation matrix $\Phi$ that is irrelevant to an original signal y, wherein the observation matrix $\Phi$ is a two-dimensional M*S matrix, S is a length of the original signal y, and M is smaller than S; compressing the original signal y based on a formula $Y_{cs}=\Phi Y$, to obtain a M*1 compressed signal $Y_{cs}$, wherein Y is a S*1 column vector that is obtained according to the original signal y; and reconstructing the compressed signal $Y_{cs}$ based on a predetermined algorithm, so as to recover the (Continued)

original signal y. The present application implements accurate recovery of the original signal at a reduced sampling rate, thereby reducing hardware requirements of the system and improving feasibility of the technical solution.

20 Claims, 8 Drawing Sheets

(51) Int. Cl.
*H04L 1/00* (2006.01)
*H04J 99/00* (2009.01)

(58) Field of Classification Search
CPC ..... H04L 45/08; H04L 1/0014; H04L 1/0052; H04L 25/4975; H04B 7/045; H04J 13/0077; H04J 15/00; H04J 13/0007; H03M 7/3062
USPC .......................................................... 370/464
See application file for complete search history.

(56) References Cited

U.S. PATENT DOCUMENTS

| | | | | |
|---|---|---|---|---|
| 2011/0075649 A1* | 3/2011 | Li | ............................ | H04L 27/34 370/343 |
| 2011/0103236 A1* | 5/2011 | Li | ........................ | H04J 13/0007 370/252 |
| 2013/0287806 A1* | 10/2013 | Donnelly | .......... | C07K 14/43559 424/185.1 |
| 2015/0124908 A1* | 5/2015 | Luo | ..................... | H03M 13/1171 375/340 |
| 2015/0149520 A1* | 5/2015 | Lee | ..................... | H03H 17/0255 708/306 |
| 2017/0041166 A1* | 2/2017 | Lin | ....................... | H04B 7/0456 |
| 2017/0230207 A1* | 8/2017 | Holguin-Sanchez | ......................... | H04L 25/03159 |

OTHER PUBLICATIONS

Xiao-Chao Xiao, et al., "Compressed Channel Estimation based on Optimized Measurement Matrix", Signal Processing, vol. 28, No. 1, Jan. 2012.
English translation of International Search Report dated Dec. 29, 2017 for PCT/CN2017/103310 filed Sep. 26, 2017, 2 pages., Dec. 29, 2017.
European Search Report for corresponding application EP17860129; Report dated May 18, 2020.
Joel A. Tropp, "Signal Recovery From Random Measurements Via Orthogonal Matching Pursuit", IEEE Transactions on Information Theory, vol. 53, No. 12, Dec. 2007, XP007909409.
Zhang Fan, "Transmission and Encoding Research on Life Status Data in WSN Combined with OVTDM and CS", Hefei New Star Instutite of Applied Technology, May 28, 2015, pp. 1-4, XP033194915.

* cited by examiner

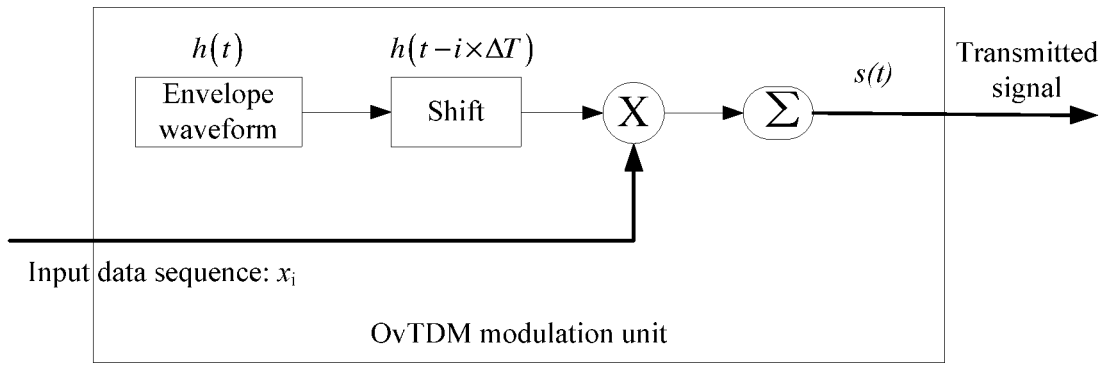
FIG. 1
$$a_0x_0 \ a_1x_0 \ a_2x_0 \ \cdots \ a_{k-1}x_0$$
$$a_0x_1 \ a_1x_1 \ a_2x_1 \ \cdots \ a_{k-1}x_1$$
$$a_0x_2 \ a_1x_2 \ a_2x_2 \ \cdots \ a_{k-1}x_2$$
$$\cdots$$
$$a_0x_{k-1} \ a_1x_{k-1} \ a_2x_{k-1} \ \cdots \ a_{k-1}x_{k-1}$$
FIG. 2
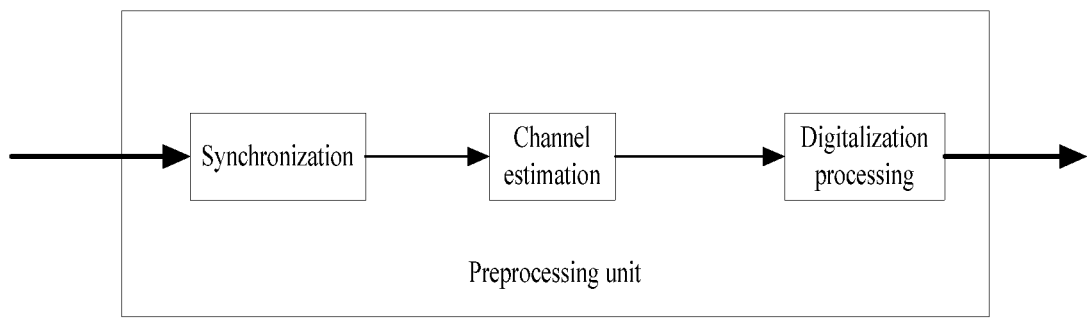
FIG. 3

SIGNAL SAMPLING AND RECOVERY METHOD AND APPARATUS APPLICABLE TO OVXDM SYSTEM, AND OVXDM SYSTEM

CROSS-REFERENCE TO RELATED APPLICATIONS

This application is a continuation application of PCT/CN2017/103310, filed Sep. 26, 2017, published as WO 2018/068629, which claims the priority of Chinese Application No. 201610885617.5, filed Oct. 10, 2016. The contents of the above-identified applications are incorporated herein by reference in their entireties.

TECHNICAL FIELD

The present invention relates to a signal sampling and recovery method and apparatus applicable to an OvXDM system, and the OvXDM system.

BACKGROUND

In an OvXDM system, a receiving end firstly samples a received analog signal to obtain a digital signal, and then performs subsequent processing, such as decoding operation, on the digital signal. However, as a total number K of times of overlapping increases, a quantity of sampling points obtained by performing a sampling operation on the signal increases, the receiving end performs the sampling operation. According to the Nyquist Sampling Theorem, a signal can be accurately reconstructed only when a sampling rate reaches at least two times of a bandwidth of the signal. This imposes a relatively high requirement of A/D on hardware in the OvXDM system, such that the hardware system faces high pressure in terms of a sampling rate and a processing speed, and a possibility of hardware implementation is reduced.

SUMMARY

The present application provides a signal sampling and recovery method and apparatus applicable to an OvXDM system, and the OvXDM system, wherein a receiving end compresses an original signal such that the signal is sampled at a relatively low sampling rate, and reconstructs a sampled signal by using a specific method to recover the original signal.

According to a first aspect of the present application, the present application provides a signal sampling and recovery method applicable to an OvXDM system, including:

constructing, based on design parameters, an observation matrix $\Phi$ that is irrelevant to an original signal y, wherein the observation matrix $\Phi$ is a two-dimensional M*S matrix, S is a length of the original signal y, and M is smaller than S;

compressing the original signal y based on a formula $Y_{cs}=\Phi Y$, to obtain a M*1 compressed signal $Y_{cs}$, wherein Y is a S*1 column vector that is obtained according to the original signal y; and reconstructing the compressed signal $Y_{cs}$ based on a predetermined algorithm, so as to recover the original signal y.

According to a second aspect of the present application, the present application provides a signal sampling and recovery apparatus applicable to an OvXDM system, including:

an observation matrix constructing unit, configured to construct, based on design parameters, an observation matrix $\Phi$ that is irrelevant to an original signal y, wherein the observation matrix $\Phi$ is a two-dimensional M*S matrix, S is a length of the original signal y, and M is smaller than S;

a compression unit, configured to compress the original signal y based on a formula $Y_{cs}=\Phi Y$, to obtain a M*1 compressed signal $Y_{cs}$, wherein Y is a S*1 column vector that is obtained according to the original signal y; and a reconstructing and recovery unit, configured to reconstruct the compressed signal $Y_{cs}$ based on a predetermined algorithm, so as to recover the original signal y.

According to a third aspect of the present application, the present application provides an OvXDM system, including the aforementioned signal sampling and recovery apparatus applicable to the OvXDM system, wherein the OvXDM system is an OvTDM system, an OvFDM system, an OvCDM system, an OvSDM system, or an OvHDM system.

The beneficial effects of the present application are as follows:

In the signal sampling and recovery method and apparatus applicable to an OvXDM system, and the OvXDM system according to the aforementioned implementations, a sparsity of an original signal transmitted by a transmitting end of the OvXDM system is fully utilized, the signal is compressed at a receiving end to sample the signal at a relatively low sampling rate, and a sampled signal is reconstructed by using a specific method, so as to recover the original signal. This implements accurate recovery of the original signal at a reduced system sampling rate, thereby reducing hardware requirements of the system and improving feasibility of the technical solution.

BRIEF DESCRIPTION OF DRAWINGS

FIG. 1 is schematic structural diagram of a transmitting end of a conventional OvTDM system;

FIG. 2 is a schematic diagram of a parallelogram rule for performing overlapped multiplexing and encoding on an input symbol by an OvTDM system;

FIG. 3 is a preprocessing unit of a conventional OvTDM receiving end;

DESCRIPTION OF EMBODIMENTS

Figure 4:
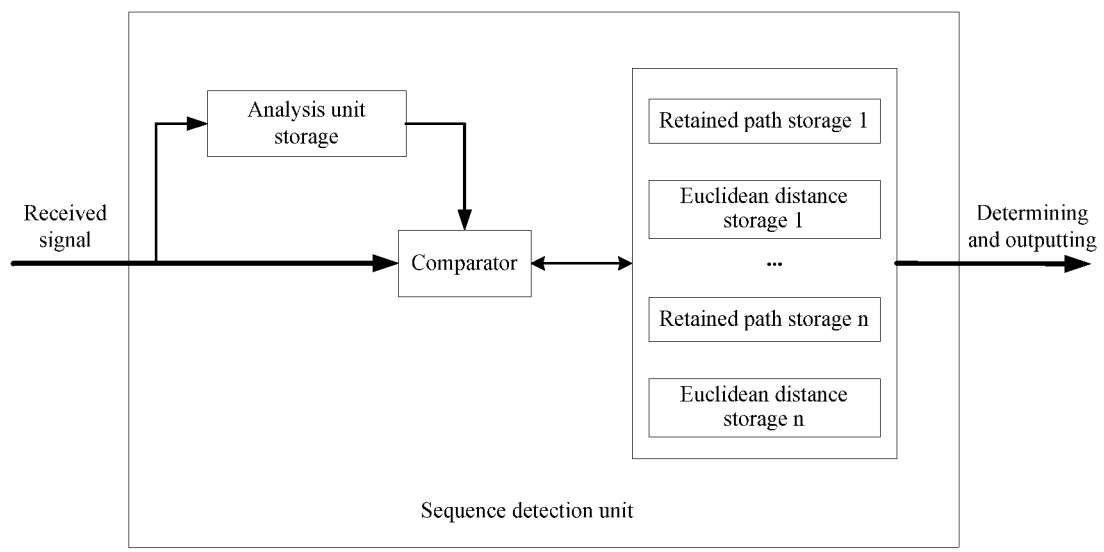
FIG. 4 is a sequence detection unit of a conventional OvTDM receiving end.

The following section further describes the present application in detail by using specific implementations with reference to the accompanying drawings.

Rapid development of information technologies increases people's requirements on information drastically. The simulation of the real world and digitalization of signal processing tools determine that signal sampling is the only way to obtain digital information from an analog signal source. The Nyquist Sampling Theorem is an important theoretical basis for sampling guidance. According to the Nyquist Sampling Theorem, a signal can be accurately reconstructed only when a sampling rate reaches twice of a signal bandwidth. However, as people's requirements on information increase, a bandwidth of a signal that carries information is wider, and a signal processing framework based thereon has higher requirements on a sampling rate and a processing speed. Therefore, difficulties in broadband signal processing increase drastically day by day. Specifically, for the OvXDM system, as a total number of times of overlapping increases, a quantity of sampling points obtained by performing a sampling operation on the signal increases, the receiving end performs the sampling operation. This imposes a relatively high requirement of A/D on hardware, such that the hardware system faces high pressure in terms of a sampling rate and a processing speed, and a possibility of hardware implementation is reduced.

In the present application, the OvXDM system is an overlapped time division multiplexing (OvTDM) system, an overlapped frequency division multiplexing (OvFDM) system, an overlapped code division multiplexing (OvCDM) system, an overlapped space division multiplexing (OvSDM) system, or an overlapped hybrid division multiplexing (OvHDM) system.

An OvTDM system is used as an example. Firstly, a transmitting end and a receiving end of the system are briefly described.

FIG. 1 shows a transmitting process of the OvTDM transmitting end. Specific steps are described as follows:

(1) Firstly, generating an envelope waveform h(t) of a transmitting signal.

(2) Shifting the envelope waveform h(t) generated in the step (1) by a predetermined time interval, to generate envelope waveforms h (t−i×ΔT) of a to-be-transmitted signal at various moments.

(3) Multiplying a to-be-transmitted symbol $x_i$ by the envelope waveforms h(t−i×ΔT) of corresponding moments generated in the step (2), to generate to-be-transmitted waveforms $x_i$h (t−i×ΔT) at various moments.

(4) Superimposing the to-be-transmitted waveforms $x_i$h (t−i×ΔT) generated in the step (3), to generate a waveform of the transmitting signal, wherein the transmitting signal may be represented as $$s(t) = \sum_i x_i h(t - i \times \Delta T).$$

An overlapped multiplexing method complies with a parallelogram rule shown in FIG. 2.

The transmitting end transmits an encoded and modulated signal by an antenna, and the signal is transmitted in a radio channel. The receiving end performs matched filtering on the received signal; then separately performs sampling and decoding on the signal; and performs a final decision on the signal and outputs a bit stream.

FIGS. 3 and 4 show a receiving process at an OvTDM receiving end. FIG. 3 is a preprocessing unit of the OvTDM receiving end, and FIG. 4 is a sequence detection unit of the OvTDM receiving end. Specific steps are described as follows:

(5) Firstly, synchronizing the received signal, wherein the synchronization operation includes carrier synchronization, frame synchronization, symbol synchronization, time synchronization, and the like.

(6) Performing digital processing on the received signal in each frame based on a sampling theorem.

(7) Segmenting the received waveform based on a waveform transmission time interval.

(8) Decoding the waveform obtained after segmenting based on a decoding algorithm.

For example, performing the decoding operation through Viterbi decoding.

Figure 5:
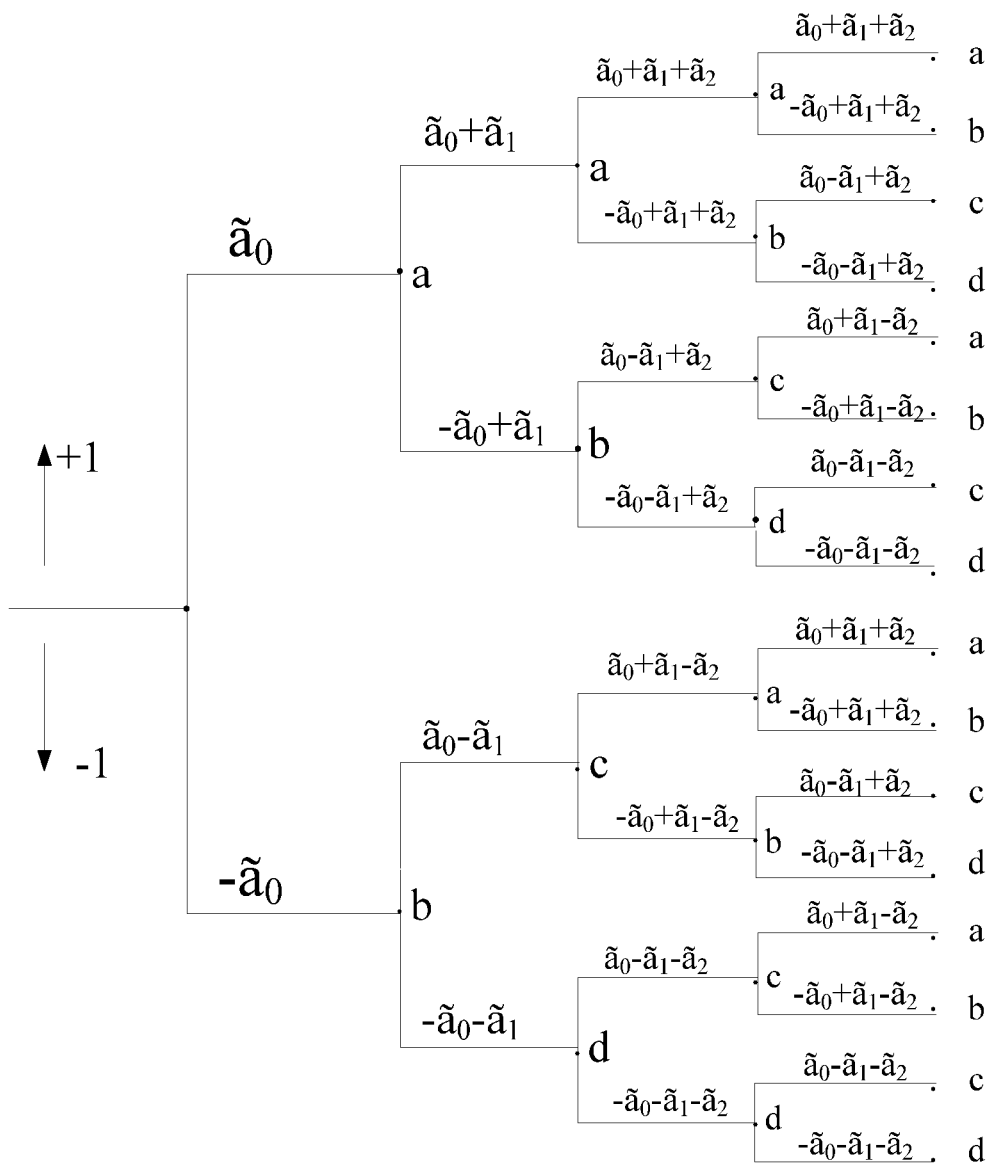
FIG. 5 is a diagram of a system input-output coding tree when the total number K of times of overlapped multiplexing of a system is 3.
Figure 6:
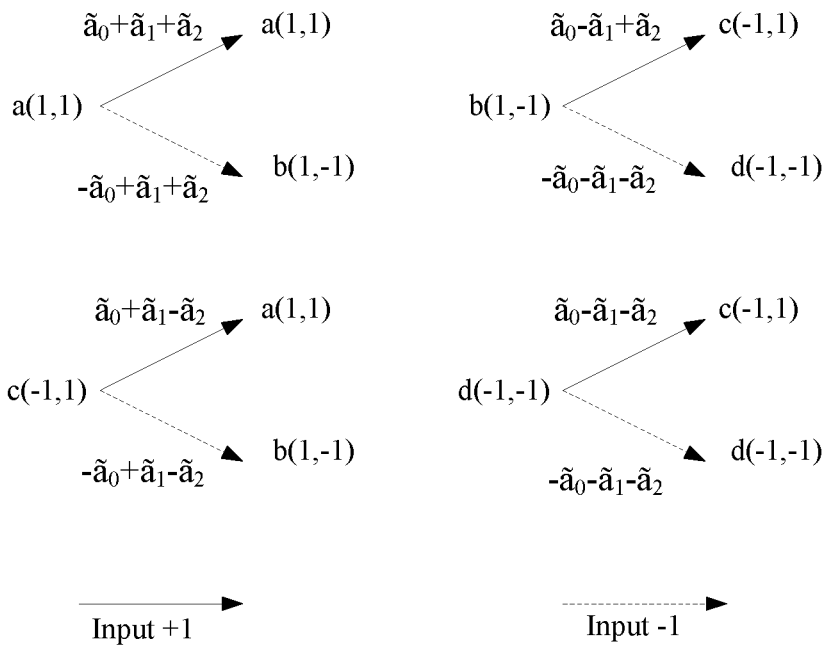
FIG. 6 is a node state transferring diagram of the system corresponding to FIG. 4.
Figure 7:
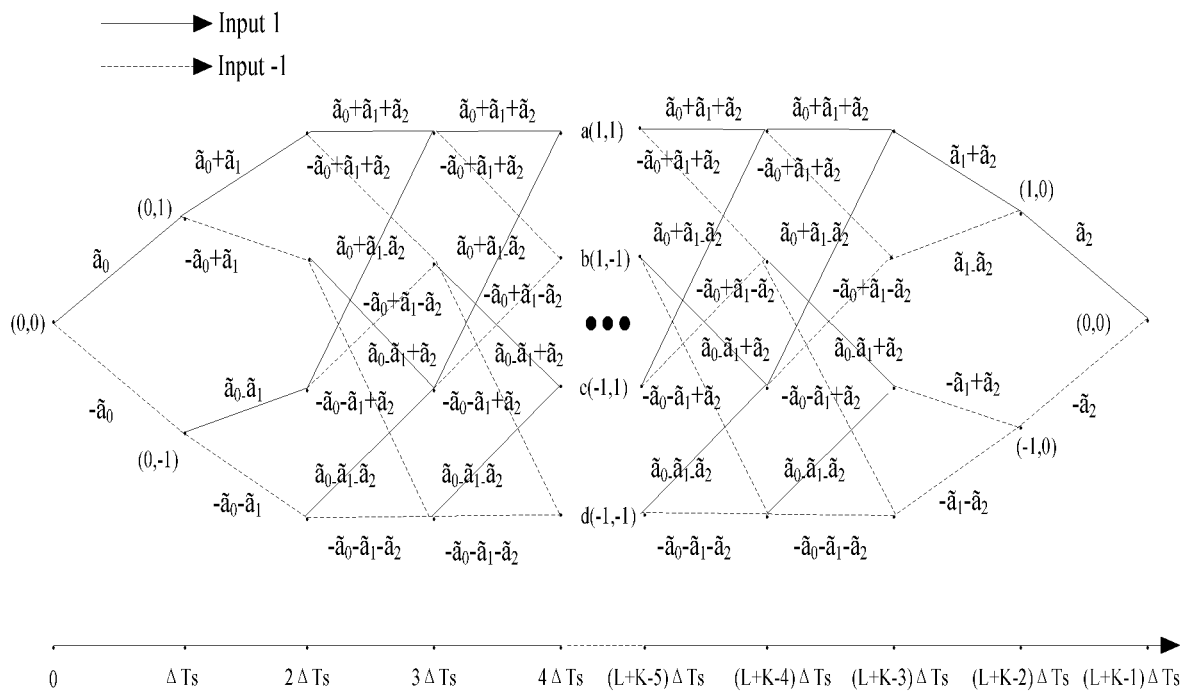
FIG. 7 is a Trellis diagram of the system corresponding to FIG. 4 or FIG. 5.

For a decoding process, referring to FIG. 5 to FIG. 7. FIG. 5 is a diagram of a system input-output coding tree when the total number K of times of overlapped multiplexing is 3, FIG. 6 is a node state transferring diagram of the corresponding system, and FIG. 7 is a trellis diagram of the system.

The aforementioned OvTDM system is still used as an example, this embodiment describes a compressed transmitting process by using a simple parameter as an example. Example A: it is assumed that a length N of bit information is 100, the total number K of times of overlapping is 4, a sampling multiple on each bit is represented as sample, wherein sample=10; and a waveform is multiplexed by using the Chebyshev's theorem. The transmitting end firstly performs BPSK modulation on the 100 bits; performs a convolutional operation on a rectangular wave and the modulated bits, to obtain S sampling points, wherein S=(N+K−1)*sample, that is, 1030 sampling points; and transmits an encoded and modulated signal through an antenna. After the receiving end receives, through an antenna, a signal y that is transmitted through a channel, a relatively high sampling rate is required so as to recover the signal.

The inventor discovered through research and practice that a signal transmitted by the transmitting end of an OvXDM system is sparse because a waveform is multiplexed. Therefore, the inventor fully utilizes a sparsity of the original signal transmitted by the transmitting end of the OvXDM system to compress a signal at the receiving end, such that the original signal is sampled at a relatively low sampling rate and the sampled signal is reconstructed by using a specific method to recover the original signal. Specific inventive concepts and principles are described as the following section.

When a signal is sparse in a transformation domain, an observation matrix irrelevant to a transform basis may be used to project a high-dimensional signal obtained by transforming to a low-dimensional space, and an original signal can be reconstructed with high probability from the small amount of projection by solving an optimization problem, wherein the projection includes sufficient information for reconstructing the signal. In this way, a sampling rate is not determined by a bandwidth of the signal. In the present application, the signal can be accurately or approximately reconstructed by collecting a small quantity of signal projection values by using the sparsity of the original signal (the signal transmitted by the transmitting end of the OvXDM system, that is, the signal received by the receiving end of the OvXDM system). Information compression is realized during sampling.

It is assumed that there is a one-dimensional discrete time signal X whose real value is a definite length, an element of the signal X is $x_n$, n=1–N, and the signal X can be considered as an N*1 dimensional column vector in $R^N$ space.

Sampling and Compressing:

(1) Constructing an orthogonal basis $\Psi$.

It is assumed that any signal in the $R^N$ spaces can be represented by using a linear combination of a N*1-dimensional base vector $\{\Psi_i\}_{i=1}^N$, wherein the base vector is orthonormal. The base vector $\{\Psi_i\}_{i=1}^N$ is used as a column vector, to form an N*N base matrix $\Psi=[\Psi_1, \Psi_2, \ldots \Psi_N]$. Therefore, any signal X can be represented as $$X = \sum_{i=1}^{N} \theta_i \Psi_i$$

or $X=\Psi\Theta$, where $\Theta$ is a column vector of a projection coefficient N*1. Persons skilled in the art can understand that X and $\Theta$ are equivalent representation of the same signal, where X is a representation of the signal in time domain, and $\Theta$ is a representation of the signal in $\Psi$ domain. If a total number of non-zero value in $\Theta$ is much smaller than N, which indicates that the signal is sparse and compressible.

(2) Constructing a measurement basis $\Phi$.

Designing a stable M*N-dimensional observation matrix $\Phi$ that is irrelevant to the transform basis $\Psi$.

(3) Compressing the signal.

A measurement set $Y=\Phi\Theta=\Phi\Psi^T X$ is obtained by measuring signal $\Theta$ in $\Psi$ domain, where the measurement set may also be represented as $Y=A_{cs}X$, $A_{cs}=\Phi\Psi$, and $A_{cs}$ is referred as a compressed sensing (CS) information operator and has a size of M*N. Because $\Phi$ is an M*N matrix and $\Theta$ is an N*1 matrix, a size of Y obtained through linear multiplying is M*1, that is, a length of a signal at a length of N is changed to M after compressing in $\Psi$ domain.

The aforementioned is a process of compressing the original signal at a relatively low sampling rate. Then, the original signal is reconstructed according to a compressed sampling signal. Multiple signal reconstructing methods are available, for example, a basic pursuit method (BP), a matching pursuit method (MP), and an orthogonal matching pursuit method (OMP). The orthogonal matching pursuit method is used as an example to describe a signal reconstruction process.

Reconstruction Process:

(4) Initializing margin $r_0=y$, reconstructed signal $x_0=0$, index set $\Gamma^0=\varphi$, and a total number n of iteration times that is started from 0.

(5) Calculating an inner product of the margin and each column of a sensing matrix $\varphi$: $g^n=\varphi^T r^{n-1}$.

(6) Obtaining an index k corresponding to an element, having a maximum absolute value, in $g^n$, where k meets $$k = \arg \max_{i \in (1,N)} |g_n[i]|.$$

(7) Updating an original subset $\phi_{\Gamma^n}=\phi_{\Gamma^{n-1}}\cup\{\varphi_k\}$ and a new index set $\Gamma^n=\Gamma^{n-1}\cup\{k\}$.

(8) Calculating an approximate solution of the signal by using a least square method: $x^n=(\phi_{\Gamma^n}^T \phi_{\Gamma^n})^{-1}\phi_{\Gamma^n}^T y$.

(9) Calculating and updating the margin: $r_0=y-\phi x^n$.

(10) Updating the total number n of iteration times to n=n+1, and determining whether an iterative stopping condition is met. If the iterative stopping condition is met, $\hat{x}=x^n$, $r=r^n$, and $\hat{x}$, r is outputted; if the iterative stopping condition is not met, the process returns to step (5) and subsequent steps are performed, $\hat{x}$ is a reconstructed and recovered signal.

The aforementioned section describes the concept and principle of a signal sampling and recovery method and apparatus applicable to an OvXDM system, and the OvXDM system of the present application. The following describes the present application in detail.

Figure 8:
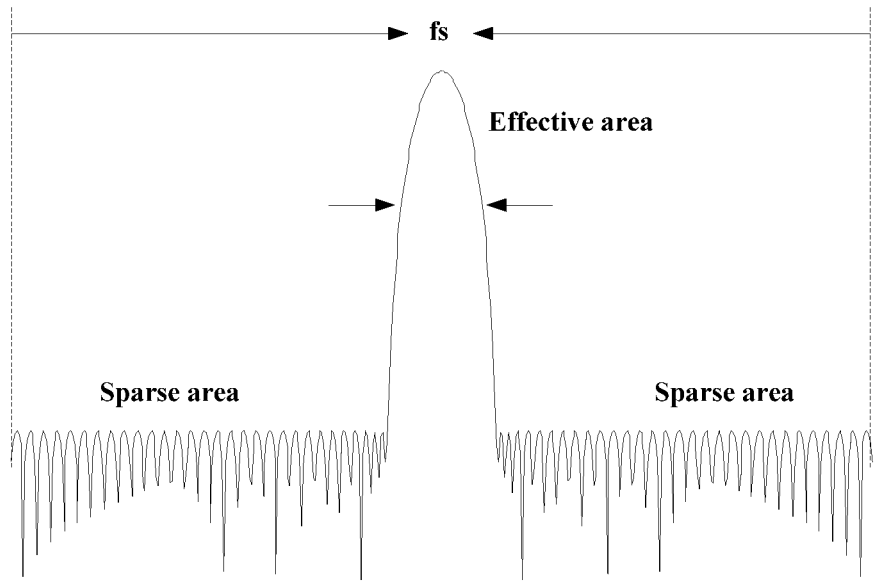
FIG. 8 is a schematic diagram of a waveform of a signal transmitted in frequency domain by a transmitting end of an OvTDM system according to an embodiment of the present application.

Because of a multiplexed waveform feature of OvXDM, a transformation domain can be found for an original signal, and the signal is sparse in the transformation domain. For example, for a signal in an OvTDM system, the signal is sparse in frequency domain. A spectral bandwidth of OvTDM is shown in FIG. 8. A system bandwidth is fs, but actually, an effective signal exists only in the middle of a small portion of bandwidth, and is sparse in other areas. Therefore, it is considered that an OvTDM signal is compressible. Similarly, it can also be proved that a signal of an OvFDM system is sparse in time domain. After a frequency-domain signal is transformed into a time-domain signal, energy exists only in a limited time, and energy in other times is gradually weakened. Therefore, an OvFDM signal is also compressible.

Figure 9:
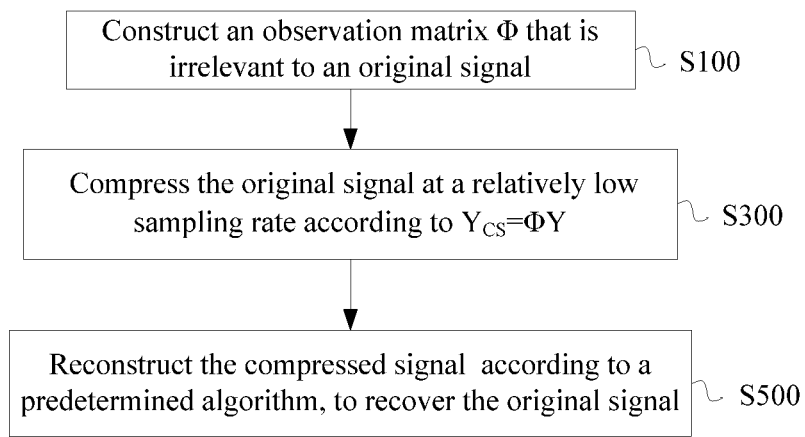
FIG. 9 is a schematic flowchart of a signal sampling and recovery method applicable to an OvXDM system according to an embodiment of the present application.

In a signal sampling and recovery method applicable to an OvXDM system (hereinafter referred to as the signal sampling and recovery method) according to the present application, in one embodiment, the OvXDM system is an OvTDM system, an OvFDM system, an OvCDM system, an OvSDM system, or an OvHDM system. Referring to FIG. 9, the signal sampling and recovering method according to the present application includes steps S100 to S500.

Step S100: constructing, based on design parameters, an observation matrix $\Phi$ that is irrelevant to an original signal y, wherein the observation matrix $\Phi$ is a two-dimensional M*S matrix, S is a length of the original signal y, and M is smaller than S. If a value of M is too small, it is difficult to reconstruct the signal; and if the value of M is too large, a compression effect cannot be achieved. Therefore, in one embodiment, the value of M is selected based on a sparsity of the original signal y. For example, in an OvTDM system, an effective bandwidth of a signal in the frequency domain is ten percent of an actual bandwidth. Therefore, when M is selected, M/S should be greater than 0.1 as much as possible. M=200 is selected herein. In addition, generally, correlation between the observation matrix and the original signal is the smaller, the better. The observation matrix is generated by using random normal distribution. The original signal y herein refers to a signal transmitted by the transmitting end of the OvXDM system.

S300: compressing the original signal y at a relatively low sampling rate based on a formula $Y_{cs}=\Phi Y$, to obtain a M*1 compressed signal $Y_{cs}$, wherein Y is a S*1 column vector that is obtained according to the original signal y. For example, as described above, the length of the original signal y is S, and the original signal y is converted directly into S*1 column vector Y. In the step S300, the signal having a length of S is actually converted into a signal having a length of M after sampling and compressing.

Figure 10:
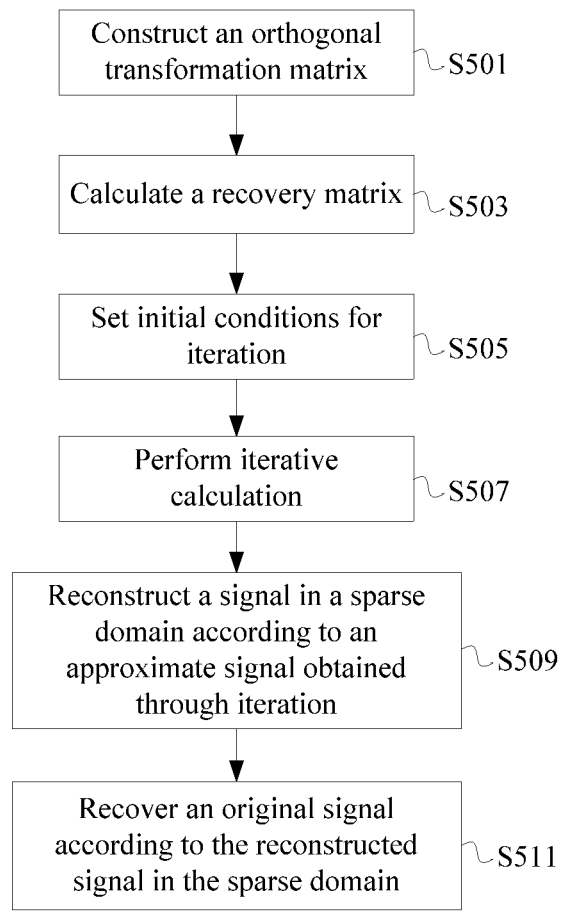
FIG. 10 is a schematic flowchart of signal reconstructing and recovery in a signal sampling and recovery method applicable to an OvXDM system according to an embodiment of the present application.

Step S500: reconstructing the compressed signal Y based on a predetermined algorithm, so as to recover the original signal y. As described above, multiple signal reconstructing methods are available, for example, a basic pursuit (BP) method, a matching pursuit (MP) method, and an orthogonal matching pursuit (OMP) method. In one embodiment, the present application uses the orthogonal matching pursuit method to perform signal reconstructing and recovery. Specifically, referring to FIG. 10. The step S500 includes steps S501 to S511.

Step S501: transforming a S*S diagonal matrix to a sparse domain of the original signal y, to obtain an orthogonal transformation matrix $\Psi$. The sparse domain means that the original signal y becomes sparse in this transformation domain. As described above, a sparse domain of an OvTDM system is a frequency domain, and a sparse domain of an OvFDM system is a time domain.

Step S503: calculating a recovery matrix T based on a formula $T=\Phi\Psi'$, wherein $\Psi'$ is a transposed matrix of $\Psi$.

Step S505: setting a margin $r_n$, an incremental matrix Aug_t, a 1*S to-be-reconstructed signal hat_Y in the sparse domain, and a total number N of iteration times, wherein N is a nonnegative integer, an initial value of the margin $r_0$ is equal to $Y_{cs}$, and an initial value of the incremental matrix Aug_t is an empty matrix. In one embodiment, the total number N of iteration times is selected based on a sparsity of the original signal y. Selection of the total number N of iteration times is similar to the selection of the value of M, and the value of N may be close or equal to the value of M. For example, in one embodiment, 200 may be selected as the total number N of iteration times.

Figure 11:
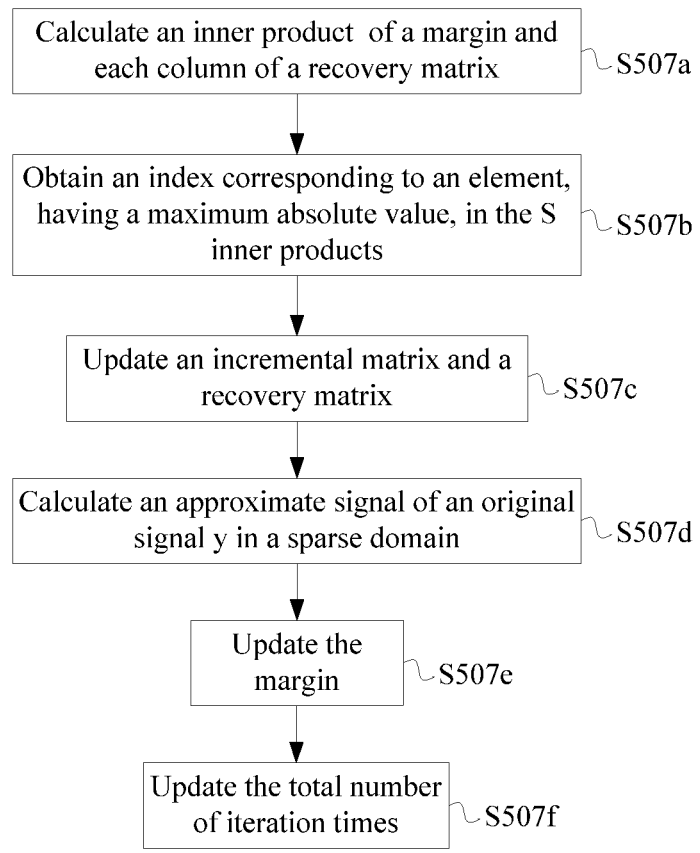
FIG. 11 is a schematic flowchart of iterative calculation for signal reconstructing and recovery in a signal sampling and recovery method applicable to an OvXDM system according to an embodiment of the present application.

Step S507: starting to perform an iterative calculation. Referring to FIG. 11. Each iterative calculation includes steps S507a to S507f.

Step S507a: calculating an inner product $g^n$ of the margin and each column of the recovery matrix T, to obtain S inner products, wherein $g^n=T'r^{n-1}$. This step actually calculates correlation between the recovery matrix and the margin. A size of the recovery matrix T is M*S and a size of $r_0$ is M*1. An inner product value is obtained by multiplying each column of matrix T by $r_0$, and a total of S inner product values are obtained. Using the aforementioned example A as an example, 1030 inner product values can be obtained in this step.

Step S507b: obtaining an index k that is corresponding to an element, having a maximum absolute value, in the S inner products, wherein k meets $$k = \arg \max_{i \in (1, S)} |g_n[i]|.$$

Step S507c: storing data of the $k^{th}$ column of the recovery matrix T in the incremental matrix Aug_t to extend the incremental matrix Aug_t, and resetting the data of the $k^{th}$ column of the recovery matrix T to zero; wherein when the incremental matrix Aug_t is extended each time, data corresponding to the $(n-1)^{th}$ iteration times is reserved, and data corresponding to the $n^{th}$ iteration times is added to the end of the incremental matrix, and n is the current iteration times.

Step S507d: calculating an approximate signal $\hat{Y}$ of the original signal y in the sparse domain, to obtain a formula $\hat{Y}=(Aug\_t'Aug\_t)^{-1} Aug\_t'*Y_{cs}$; wherein ($\bullet$)' represents a transposed operation on a matrix, and $(\bullet)^{-1}$ represents an inversion operation on a matrix. In one embodiment, an approximate solution of a frequency-domain signal, that is, the approximate signal $\hat{Y}$, can be calculated by using a least square method.

Step S507e: Calculating a margin between a compressed signal $Y_{cs}$ and the approximate signal $\hat{Y}$, and updating $r_n$; wherein $r_n=Y_{cs}-Aug\_t\hat{Y}$.

Step S507f: Adding 1 to n that represents the current iteration times, so as to update the total number of iteration times, until N iterative operations are completed. In addition, many conditions can be set for stopping the iterative operation. For example, when the margin is smaller than a predetermined value, it is considered that the signal in the sparse domain has been recovered, and the iterative operation is stopped. Alternatively, the total number of iteration times may be set, and the iterative operation is stopped when the total number of iteration times is reached. In this embodiment, the iterative operation is stopped by setting the total number of iteration times.

Step S509: For all approximate signals $\hat{Y}$ obtained in the N iterative operations, updating, according to the index k obtained in each iterative operation, the approximate signal $\hat{Y}$ obtained in each iterative operation to a column that is corresponding to the index k and is in the matrix of the to-be-reconstructed signal hat_Y in the sparse domain. For example, when the total number of iteration times is 200, in this step, 200 approximate signals $\hat{Y}$ are obtained through 200 iterative operations. Each approximate signal $\hat{Y}$ is updated, according to the index k obtained in the step S507b, to a column that is corresponding to the index and is in the matrix of the to-be-reconstructed signal hat_Y in the sparse domain, so as to obtain S vectors. In the column of the matrix, there are only 200 data, and others are all zero; which corresponds to sparse signal distribution in the sparse domain.

Figure 12:
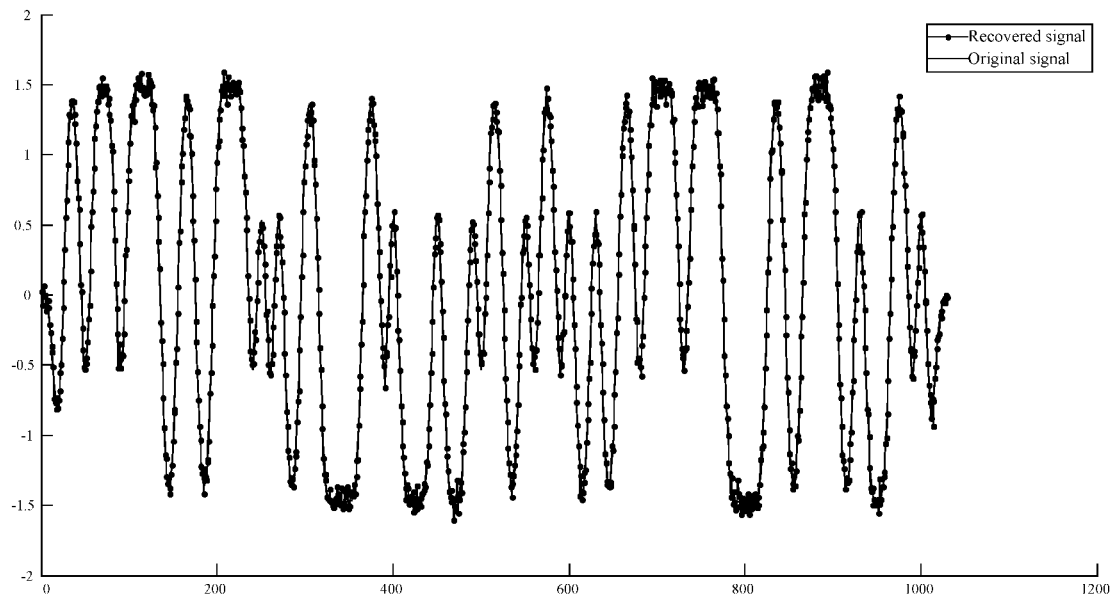
FIG. 12 is a schematic diagram of comparison between an original signal and a recovered signal that is obtained through reconstructing and recovering by using a signal sampling and recovery method according to an embodiment of the present application.
Figure 13:
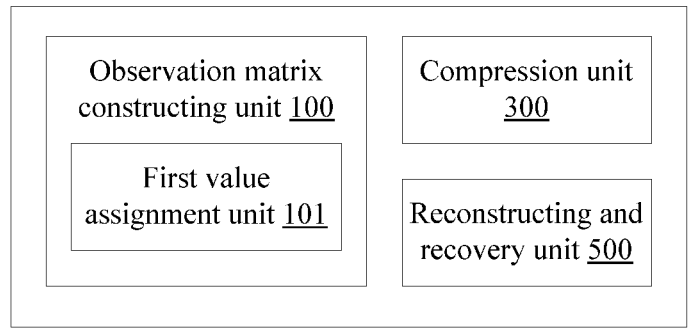
FIG. 13 is a schematic structural diagram of a signal sampling and recovery apparatus applicable to an OvXDM system according to an embodiment of the present application.

Step S511: Recovering the original signal y based on a formula $y=\Psi*hat\_Y$. An OvTDM system is still used as an example, this step is to recover, by using a transform matrix $\Psi$, a time-domain signal $y=\Psi*hat\_Y$ corresponding to a compressed spectral-domain signal, wherein a length of the time-domain signal is S, and y is the recovered original signal. It can be seen from FIG. 12 that the reconstructed signal has recovered the original signal at high accuracy.

The aforementioned section is the signal sampling and recovery method applicable to an OvXDM system according to present application. Correspondingly, the present application further proposes the OvXDM system, including a signal sampling and recovery apparatus applicable to the OvXDM system, wherein the OvXDM system is an OvTDM system, an OvFDM system, an OvCDM system, an OvSDM system, or an OvHDM system. For the signal sampling and recovery apparatus applicable to an OvXDM system according to present application, referring to FIG.

13. The apparatus includes an observation matrix constructing unit 100, a compression unit 300, and reconstructing and recovery unit 500.

The observation matrix constructing unit 100 is configured to construct, based on design parameters, an observation matrix Φ that is irrelevant to an original signal y, wherein the observation matrix Φ is a two-dimensional M*S matrix, S is a length of the original signal y, and M is smaller than S. If a value of M is too small, it is difficult to reconstruct the signal; and if the value of M is too large, a compression effect cannot be achieved. Therefore, in one embodiment, the observation matrix constructing unit 100 further includes a first value assignment unit 101, configured to select a value of M based on a sparsity of the original signal y. For example, in one example of an OvTDM system, an effective bandwidth of a signal in the frequency domain is ten percent of an actual bandwidth. Therefore, when M is selected, M/S should be greater than 0.1 as much as possible. M=200 is selected herein. In addition, generally, correlation between the observation matrix and the original signal is the smaller, the better. The observation matrix is generated by using random normal distribution. The original signal y herein refers to a signal transmitted by the transmitting end of the OvXDM system.

The compression unit 300 is configured to compress the original signal y at a relatively low sampling rate based on a formula $Y_{cs}=\Phi Y$, to obtain a M*1 compressed signal $Y_{cs}$, wherein Y is a S*1 column vector that is obtained according to the original signal y.

Figure 14:
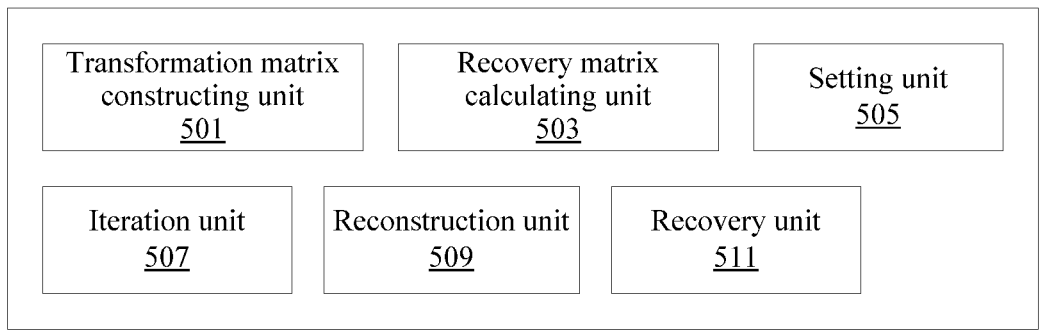
FIG. 14 is a schematic structural diagram of a reconstructing and recovery unit in a signal sampling and recovery apparatus applicable to an OvXDM system according to an embodiment of the present application.

The reconstructing and recovery unit 500 is configured to reconstruct the compressed signal $Y_{cs}$ based on a predetermined algorithm, so as to recover the original signal y. Many signal reconstructing methods are available for implementing the reconstructing and recovery unit 500, for example, a basic pursuit (BP) method, a matching pursuit (MP) method, and an orthogonal matching pursuit (OMP) method. In present application, the reconstructing and recovery unit 500 is implemented by using a principle in which the orthogonal matching pursuit method is used to perform signal reconstructing and recovery. Specifically, referring to FIG. 14. The reconstructing and recovery unit 500 includes a transformation matrix constructing unit 501, a recovery matrix calculating unit 503, a setting unit 505, an iteration unit 507, a reconstruction unit 509, and a recovery unit 511.

The transformation matrix constructing unit 501 is configured to transform a S*S diagonal matrix to a sparse domain of the original signal y, to obtain an orthogonal transformation matrix Ψ.

The recovery matrix calculating unit 503 is configured to calculate a recovery matrix T based on a formula $T=\Phi\Psi'$, wherein Ψ' is a transposed matrix of Ψ.

The setting unit 505 is configured to set a margin $r_n$, an incremental matrix Aug_t, a 1*S to-be-reconstructed signal hat_Y in the sparse domain, and a total number N of iteration times, wherein N is a nonnegative integer, an initial value of the margin $r_0$ is equal to $Y_{cs}$, and an initial value of the incremental matrix Aug_t is an empty matrix.

Figure 15:
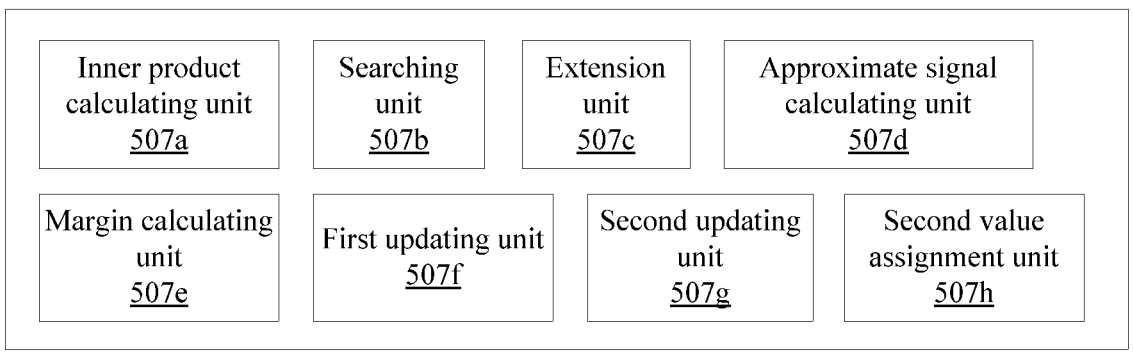
FIG. 15 is a schematic structural diagram of an iteration unit according to an embodiment of the present application.

The iteration unit 507 is configured to perform an iterative calculation. Referring to FIG. 15, the iteration unit 507 includes an inner product calculating unit 507a, a searching unit 507b, an extension unit 507c, an approximate signal calculating unit 507d, a margin calculating unit 507e, a first updating unit 507f, and a second updating unit 507g. In one embodiment, the iteration unit 507 may further include a second value assignment unit 507h.

The inner product calculating unit 507a is configured to calculate an inner product $g^n$ of the margin and each column of the recovery matrix T, to obtain S inner products, wherein $g^n=T'r^{n-1}$.

The searching unit 507b is configured to obtain an index k that is corresponding to an element, having a maximum absolute value, in the S inner products, wherein k meets $$k = \arg \max_{i\in(1,S)} |g_n[i]|.$$

The extension unit 507c is configured to store data of the $k^{th}$ column of the recovery matrix T in the incremental matrix Aug_t to extend the incremental matrix Aug_t, and reset the data of the $k^{th}$ column of the recovery matrix T to zero; wherein when the incremental matrix Aug_t is extended each time, data corresponding to the $(n-1)^{th}$ iteration times is reserved, and data corresponding to the $n^{th}$ iteration times is added to the end of the incremental matrix, and n is the current iteration times.

In one embodiment, the second value assignment unit 507h is configured to select the total number N of iteration times based on a sparsity of the original signal y.

The approximate signal calculating unit 507d is configured to calculate an approximate signal Ŷ of the original signal y in the sparse domain, to obtain a formula $\hat{Y}=(Aug\_t'Aug\_t)^{-1} Aug\_t'*Y_{cs}$; wherein (●)' represents a transposed operation on a matrix, and (●)$^{-1}$ represents an inversion operation on a matrix.

The margin calculating unit 507e is configured to calculate a margin between the compressed signal $Y_{cs}$ and the approximate signal Ŷ.

The first updating unit 507f is configured to update $r_n$; wherein $r_n=Y_{cs}-Aug\_t\hat{Y}$.

The second updating unit 507g is configured to add 1 to n that represents the current iteration times, so as to update the total number of iteration times, until N iterative operations are completed.

The reconstructing unit 509 is configured to: for all approximate signals Ŷ obtained in the N iterative operations, update, according to the index k obtained in each iterative operation, the approximate signal Ŷ obtained in each iterative operation to a column that is corresponding to the index k and is in the matrix of the to-be-reconstructed signal hat_Y in the sparse domain.

The recovery unit 511 is configured to recover the original signal y according to a formula y=Ψ*hat_Y.

In the present application, a sparsity of the original signal transmitted by the transmitting end of the OvXDM system is fully utilized; and the receiving end compresses the original signal such that the signal is sampled at a relatively low sampling rate, and reconstructs a sampled signal by using a predetermined method to recover the original signal. Specifically, in the present application, a signal is described by using other transforming spaces, and a new theoretical framework for signal description and processing is established, to ensure that the original signal is sampled at a sampling rate much lower than a sampling rate required by the Nyquist Sampling Theorem without losing information. In addition, the original signal can be completely recovered according to the sampled signal. In this way, requirements of hardware are greatly reduced in system design, and feasibility is also greatly improved. This solves the problems that hardware implementation is difficult and feasibility of the technical solution is reduced because when the total number of times of overlapping in an OvXDM system is relatively large, the receiving end needs to use a relatively high sampling rate and processing speed to recover the original signal. When the total number of times of overlapping is relatively large, the present application implements accurate recovery of the original signal at a reduced system sampling rate, thereby reducing hardware requirements of the system and improving feasibility of the technical solution.

The aforementioned contents are further detailed descriptions of the present application in combination with specific implementation, and it cannot be construed that specific implementations of the present application is only restricted to these descriptions. Persons with ordinary skills in the art may still make several simple deductions or replacements without departing from the inventive concepts of the present application.

The invention claimed is:

1. A signal sampling and recovery method applicable to an Overlapped X Division Multiplexing (OvXDM) system, comprising:

constructing, based on design parameters, an observation matrix $\Phi$ that is irrelevant to an original signal y, wherein the observation matrix $\Phi$ is a two-dimensional M*S matrix, S is a length of the original signal y, and M is smaller than S, and M/S is greater than 0.1;

compressing the original signal y based on a formula $Y_{cs}=\Phi Y$, to obtain a M*1 compressed signal $Y_{cs}$, wherein Y is a S*1 column vector that is obtained according to the original signal y; and reconstructing the compressed signal $Y_{cs}$ based on a predetermined algorithm, so as to recover the original signal y.

2. The signal sampling and recovery method applicable to an OvXDM system according to claim 1, wherein a value of M is selected based on a sparsity of the original signal y.

3. The signal sampling and recovery method applicable to an OvXDM system according to claim 1, wherein the step of reconstructing the compressed signal $Y_{cs}$ based on a predetermined algorithm, to recover the original signal y comprises:

transforming a S*S diagonal matrix to a sparse domain of the original signal y, to obtain an orthogonal transformation matrix $\Psi$;

calculating a recovery matrix T based on a formula $T=\Phi\Psi'$, wherein $\Psi'$ is a transposed matrix of $\Psi$;

setting a margin $r_n$, an incremental matrix Aug_t, a 1*S to-be-reconstructed signal hat_Y in the sparse domain, and a total number N of iteration times, wherein N is a nonnegative integer, an initial value of the margin $r_0$ is equal to $Y_{cs}$, and an initial value of the incremental matrix Aug_t is an empty matrix;

starting to perform an iterative calculation, wherein each iterative calculation comprises steps of:

calculating an inner product $g^n$ of the margin and each column of the recovery matrix T, to obtain S inner products, wherein $g^n=T'r^{n-1}$;

obtaining an index k that is corresponding to an element, having a maximum absolute value, in the S inner products, wherein k meets $$k = \arg\max_{i\in(1,S)} |g_n[i]|;$$

storing data of the $k^{th}$ column of the recovery matrix T in the incremental matrix Aug_t to extend the incremental matrix Aug_t, and resetting the data of the $k^{th}$ column of the recovery matrix T to zero; wherein when the incremental matrix Aug_t is extended each time, data corresponding to the $(n-1)^{th}$ iteration times is reserved, and data corresponding to the $n^{th}$ iteration times is added to the end of the incremental matrix, and n is the current iteration times;

calculating an approximate signal $\hat{Y}$ of the original signal y in the sparse domain, to obtain a formula $\hat{Y}=(Aug\_t'\ Aug\_t)^{-1}\ Aug\_t'*Y_{cs}$; wherein ($\bullet$) represents a transposed operation on a matrix, and $(\bullet)^{-1}$ represents an inversion operation on a matrix;

calculating a margin between a compressed signal $Y_{cs}$ and the approximate signal $\hat{Y}$, to obtain a formula $r_n=Y_{cs}-Aug\_t\hat{Y}$; and adding 1 to n that represents the current iteration times, so as to update a total number of iteration times, until N iterative operations are completed;

for all approximate signals $\hat{Y}$ obtained in the N iterative operations, updating, based on the index k obtained in each iterative operation, the approximate signal $\hat{Y}$ obtained in each iterative operation to a column that is corresponding to the index k and is in the matrix of the to-be-reconstructed signal hat_Y in the sparse domain;

recovering the original signal y based on a formula $y=\Psi*hat\_Y$.

4. The signal sampling and recovery method applicable to an OvXDM system according to claim 3, wherein the total number N of iteration times is selected based on a sparsity of the original signal y.

5. The signal sampling and recovery method applicable to an OvXDM system according to claim 1, wherein the predetermined algorithm comprises basic pursuit (BP) method, a matching pursuit (MP) method, or an orthogonal matching pursuit (OMP) method.

6. The signal sampling and recovery method applicable to an OvXDM system according to claim 1, wherein the OvXDM system is an Overlapped Time Division Multiplexing (OvTDM) system, an Overlapped Frequency Division Multiplexing (OvFDM) system, an Overlapped Code Division Multiplexing (OvCDM) system, an Overlapped Space Division Multiplexing (OvSDM) system, or an Overlapped Hybrid Division Multiplexing (OvHDM) system.

7. A signal sampling and recovery apparatus applicable to an Overlapped X Division Multiplexing (OvXDM) system, comprising a hardware processor and a memory, the hardware processor is configured to execute programming units stored in the memory, and the programming units comprise:

an observation matrix constructing unit, configured to construct, based on design parameters, an observation matrix $\Phi$ that is irrelevant to an original signal y, wherein the observation matrix $\Phi$ is a two-dimensional M*S matrix, S is a length of the original signal y, and M is smaller than S, and M/S is greater than 0.1;

a compression unit, configured to compress the original signal y based on a formula $Y_{cs}=\Phi Y$, to obtain a M*1 compressed signal $Y_{cs}$, wherein Y is a S*1 column vector that is obtained according to the original signal y; and a reconstructing and recovery unit, configured to reconstruct the compressed signal $Y_{cs}$ based on a predetermined algorithm, so as to recover the original signal y.

8. The signal sampling and recovery apparatus applicable to an OvXDM system according to claim 7, wherein the observation matrix constructing unit further comprises a first value assignment unit, configured to select a value of M based on a sparsity of the original signal y.

9. The signal sampling and recovery apparatus applicable to an OvXDM system according to claim 8, wherein M is equal to 200.

10. The signal sampling and recovery apparatus applicable to an OvXDM system according to claim 7, wherein the reconstructing and recovery unit comprises:
   a transformation matrix constructing unit, configured to transform a S*S diagonal matrix to a sparse domain of the original signal y, to obtain an orthogonal transformation matrix Ψ;
   a recovery matrix calculating unit, configured to calculate a recovery matrix T based on a formula T=ΦΨ', where Ψ' is a transposed matrix of Ψ;
   a setting unit, configured to set a margin $r_n$, an incremental matrix Aug_t, a 1*S to-be-reconstructed signal hat_Y in the sparse domain, and a total number N of iteration times, wherein N is a nonnegative integer, an initial value of the margin $r_0$ is equal to $Y_{cs}$, and an initial value of the incremental matrix Aug_t is an empty matrix;
   an iteration unit, configured to perform iterative calculation, and comprising:
   an inner product calculating unit, configured to calculate an inner product $g^n$ of the margin and each column of the recovery matrix T, to obtain S inner products, wherein $g^n=T'r^{n-1}$;
   a searching unit, configured to obtain an index k that is corresponding to an element, having a maximum absolute value, in the S inner products, wherein k meets $$k = \arg\max_{i \in (1,S)} |g_n[i]|;$$

an extension unit, configured to store data of the $k^{th}$ column of the recovery matrix T in the incremental matrix Aug_t to extend the incremental matrix Aug_t, and resetting the data of the $k^{th}$ column of the recovery matrix T to zero; wherein when the incremental matrix Aug_t is extended each time, data corresponding to the $(n-1)^{th}$ iteration times is reserved, and data corresponding to the $n^{th}$ iteration times is added to the end of the incremental matrix, and n is the current iteration times;
   an approximate signal calculating unit, configured to calculate an approximate signal Ŷ of the original signal y in the sparse domain, to obtain a formula Ŷ=(Aug_t' Aug_t)$^{-1}$Aug_t'*$Y_{cs}$; wherein (●)' represents a transposed operation on a matrix, and (●)$^{-1}$ represents an inversion operation on a matrix;
   a margin calculating unit, configured to calculate a margin between a compressed signal $Y_{cs}$ and the approximate signal Ŷ, to obtain a formula $r_n$=$Y_{cs}$−Aug_t Ŷ;
   a first updating unit, configured to update $r_n$, wherein $r_n$=$Y_{cs}$−Aug_t Ŷ; and
   a second updating unit, configured to add 1 to n that represents the current iteration times, so as to update a total number of iteration times, until N iterative operations are completed;
   a reconstruction unit, configured to: for all approximate signals Ŷ obtained in the N iterative operations, update, based on the index k obtained in each iterative operation, the approximate signal Ŷ obtained in each iterative operation to a column that is corresponding to the index k and is in the matrix of the to-be-reconstructed signal hat_Y in the sparse domain; and
   a recovery unit, configured to recover the original signal y based on a formula y=Ψ*hat_Y.

11. The signal sampling and recovery apparatus applicable to an OvXDM system according to claim 10, wherein the iteration unit further comprises a second value assignment unit, configured to select the total number N of iteration times based on a sparsity of the original signal y.

12. The signal sampling and recovery apparatus applicable to an OvXDM system according to claim 7, wherein the predetermined algorithm comprises basic pursuit (BP) method, a matching pursuit (MP) method, or an orthogonal matching pursuit (OMP) method.

13. The signal sampling and recovery apparatus applicable to an OvXDM system according to claim 7, wherein the OvXDM system is an Overlapped Time Division Multiplexing (OvTDM) system, an Overlapped Frequency Division Multiplexing (OvFDM) system, an Overlapped Code Division Multiplexing (OvCDM) system, an Overlapped Space Division Multiplexing (OvSDM system), or an Overlapped Hybrid Division Multiplexing (OvHDM) system.

14. An Overlapped X Division Multiplexing (OvXDM) system, comprising the signal sampling and recovery apparatus, wherein the signal sampling and recovery apparatus comprises a hardware processor and a memory, the hardware processor is configured to execute programming units stored in the memory, and the programming units comprise:
   an observation matrix constructing unit, configured to construct, based on design parameters, an observation matrix Φ that is irrelevant to an original signal y, wherein the observation matrix Φ is a two-dimensional M*S matrix, S is a length of the original signal y, and M is smaller than S, and M/S is greater than 0.1;
   a compression unit, configured to compress the original signal y based on a formula $Y_{cs}$=ΦY, to obtain a M*1 compressed signal $Y_{cs}$, wherein Y is a S*1 column vector that is obtained according to the original signal y; and
   a reconstructing and recovery unit, configured to reconstruct the compressed signal $Y_{cs}$ based on a predetermined algorithm, so as to recover the original signal y.

15. The OvXDM system according to claim 14, wherein the observation matrix constructing unit further comprises a first value assignment unit, configured to select a value of M based on a sparsity of the original signal y.

16. The OvXDM system according to claim 14, wherein M is equal to 200.

17. The OvXDM system according to claim 14, wherein the reconstructing and recovery unit comprises:
   a transformation matrix constructing unit, configured to transform a S*S diagonal matrix to a sparse domain of the original signal y, to obtain an orthogonal transformation matrix Ψ;
   a recovery matrix calculating unit, configured to calculate a recovery matrix T based on a formula T=Φψ', where Ψ' is a transposed matrix of Ψ;
   a setting unit, configured to set a margin rn, an incremental matrix Aug_t, a 1*S to-be-reconstructed signal hat_Y in the sparse domain, and a total number N of iteration times, wherein N is a nonnegative integer, an initial value of the margin r0 is equal to $Y_{cs}$, and an initial value of the incremental matrix Aug_t is an empty matrix;

an iteration unit, configured to perform iterative calculation, and comprising:

an inner product calculating unit, configured to calculate an inner product gn of the margin and each column of the recovery matrix T, to obtain S inner products, wherein $g^n=T'r^{n-1}$;

a searching unit, configured to obtain an index k that is corresponding to an element, having a maximum absolute value, in the S inner products, wherein k meets $$k = \underset{i \in (1,S)}{\arg\max} \, i \in (1, S)|g_n[i]|;$$

an extension unit, configured to store data of the kth column of the recovery matrix T in the incremental matrix Aug_t to extend the incremental matrix Aug_t, and resetting the data of the kth column of the recovery matrix T to zero; wherein when the incremental matrix Aug_t is extended each time, data corresponding to the (n−1)th iteration times is reserved, and data corresponding to the nth iteration times is added to the end of the incremental matrix, and n is the current iteration times;

an approximate signal calculating unit, configured to calculate an approximate signal $\hat{Y}$ of the original signal y in the sparse domain, to obtain a formula $\hat{Y}=(Aug\_t' \, Aug\_t)^{-1}Aug\_t'*Y_{cs}$; wherein $(\bullet)'$ represents a transposed operation on a matrix, and $(\bullet)^{-1}$ represents an inversion operation on a matrix;

a margin calculating unit, configured to calculate a margin between a compressed signal $Y_{cs}$ and the approximate signal $\hat{Y}$, to obtain a formula $r_n=Y_{cs}-Aug\_t\hat{Y}$;

a first updating unit, configured to update rn, wherein $r_n=Y_{cs}=Aug\_t\hat{Y}$; and a second updating unit, configured to add 1 to n that represents the current iteration times, so as to update a total number of iteration times, until N iterative operations are completed;

a reconstruction unit, configured to: for all approximate signals $\hat{Y}$ obtained in the N iterative operations, update, based on the index k obtained in each iterative operation, the approximate signal $\hat{Y}$ obtained in each iterative operation to a column that is corresponding to the index k and is in the matrix of the to-be-reconstructed signal hat_Y in the sparse domain; and a recovery unit, configured to recover the original signal y based on a formula $y=\Psi*hat\_Y$.

18. The OvXDM system according to claim 17, wherein the iteration unit further comprises a second value assignment unit, configured to select the total number N of iteration times based on a sparsity of the original signal y.

19. The OvXDM system according to claim 14, wherein the predetermined algorithm comprises basic pursuit (BP) method, a matching pursuit (MP) method, or an orthogonal matching pursuit (OMP) method.

20. The OvXDM system according to claim 14, wherein the OvXDM system is an Overlapped Time Division Multiplexing (OvTDM) system, an Overlapped Frequency Division Multiplexing (OvFDM) system, an Overlapped Code Division Multiplexing (OvCDM) system, an Overlapped Space Division Multiplexing (OvSDM) system, or an Overlapped Hybrid Division Multiplexing (OvHDM) system.

\* \* \* \* \*